(12) United States Patent
Kub et al.

(10) Patent No.: US 6,767,749 B2
(45) Date of Patent: Jul. 27, 2004

(54) METHOD FOR MAKING PIEZOELECTRIC RESONATOR AND SURFACE ACOUSTIC WAVE DEVICE USING HYDROGEN IMPLANT LAYER SPLITTING

(75) Inventors: Francis J. Kub, Arnold, MD (US); Karl D. Hobart, Uppermarlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 89 days.

(21) Appl. No.: 10/126,662

(22) Filed: Apr. 22, 2002

(65) Prior Publication Data

US 2003/0199105 A1 Oct. 23, 2003

(51) Int. Cl.[7] .............................................. H01L 21/00
(52) U.S. Cl. .............................. 438/3; 438/29; 438/48
(58) Field of Search ................................ 438/3, 29, 48

(56) References Cited

U.S. PATENT DOCUMENTS

| | | |
|---|---|---|
| 882,987 A | 8/1908 | Srikrishnan |
| 4,013,983 A | 3/1977 | Hartemann |
| 4,062,105 A | 12/1977 | Day |
| 5,374,564 A | 12/1994 | Bruel |
| 5,391,257 A | 2/1995 | Sullivan et al. |
| 5,401,544 A | 3/1995 | Nakahata et al. |
| 5,446,330 A | 8/1995 | Eda et al. |
| 5,448,126 A | 9/1995 | Eda et al. |
| 5,630,949 A | 5/1997 | Lakin |
| 5,714,395 A | 2/1998 | Bruel |
| 5,877,070 A | 3/1999 | Goesele et al. |
| 5,966,620 A | 10/1999 | Sakaguchi et al. |
| 5,993,677 A | 11/1999 | Biasse et al. |
| 5,994,207 A | 11/1999 | Henley et al. |
| 6,010,579 A | 1/2000 | Henley et al. |
| 6,020,252 A | 2/2000 | Aspar et al. |
| 6,054,370 A | 4/2000 | Doyle |
| 6,103,597 A | 8/2000 | Aspar et al. |
| 6,120,597 A | 9/2000 | Levy et al. |
| 6,328,796 B1 | 12/2001 | Kub et al. |
| 6,445,265 B1 * | 9/2002 | Wright ........................ 333/193 |
| 6,472,954 B1 * | 10/2002 | Ruby et al. .................. 333/133 |
| 6,534,900 B2 * | 3/2003 | Aigner et al. ................ 310/326 |
| 6,540,827 B1 * | 4/2003 | Levy et al. ..................... 117/3 |
| 2003/0064535 A1 * | 4/2003 | Kub et al. ...................... 438/22 |

OTHER PUBLICATIONS

F.J. Kub, K.D. Hobart, Single–Crystal Ferroelectric Microwave Capacitor Fabricated By Separation By Hydrogen Implantation, Electronics Letters, Mar. 18th, 1999, vol. 35, No. 6.

L.J. Huang, Q.Y. Tong, U. Gosele, Hydrogen–Implantation Induced Blistering And Layer Transfer Of LaAlO3 And Sapphire, Electrochemical And Solid–State Letters, 2 (5) 238–239 (1999), c The Electrochemical Society, Inc.

(List continued on next page.)

Primary Examiner—Alexander Ghyka
(74) Attorney, Agent, or Firm—John J. Karasek; George A. Kap

(57) ABSTRACT

Thin layers of high quality single-crystal piezoelectric material, high temperature sintered piezoelectric material, or high quality thin film grown material are transferred to an appropriate substrate using hydrogen ion implant layer splitting and bonding. The substrate to which the thin piezoelectric material layer is transferred may contain CMOS or GaAs circuitry. When the substrate contains CMOS or GaAs circuitry, the circuitry on the surface of the GaAs or CMOS substrate may be covered with an oxide. The oxide is then planarized using chemical mechanical polishing, and the thin film resonator material is transferred to the GaAs or CMOS circuit using wafer bonding and hydrogen ion layer splitting.

20 Claims, 12 Drawing Sheets

OTHER PUBLICATIONS

B. Aspar, H. Moriceau, E. Jalaguier, C. Lagahe, A. Soubie, B. Biasse, A.M. Papon, A. Claverie, J. Grisolia, G. Benassayag, F. Letertre, O. Rayssac, T. Barge, C. Maleville, B. Ghyselen, The Generic Nature Of The Smart–Cut Process For This Film Transfer, Electronic Materials, vol. 30, No. 7, 2001, 834–839.

M. Bruel, Silicon On Insulator Material Technology, Electronics Letters, Jul. 6th, 1995, vol. 31, No. 14, 1201–1202.

Q.Y. Tong, K. Gutjahr, S. Hopfe, U. Gosele, T.H. Lee, Layer Splitting Process In Hydrogen–Implanted Si, Ge, SiC, And Diamond Substrates, Jan. 10th, 1997, c. American Institute Of Physics, 3 Pages.

K.D. Hobart, F.J. Kub, Transfer, Of GaSb Thin Film To Insulating Substrate Via Separation By Hydrogen Implantation, electronics Letters, Apr. 15th 1999, vol. 35, No. 8.

K.D. Hobart, F.J. Kub, G.G. Jernigan, M.E. Twigg, P.E. Thompson, Fabrication Of SOI Substrates With Ultra–Thin Si Layers, Electronics Letters, Jun. 11th 1998, vol. 34, No. 12.

F.I. Kub, K.D. Hobart, M. Spencer, Method Of Making Mosaic Array Of Thin Semiconductor Material On Large Substrates, NC 79,225, Serial # 10/046,534, Filed Jan. 16, 2002, Patent Pending.

F.J. Kub, K.D. Hobart, Method For Transferring Thin Filter Layer Material To A Flexible Substrate Using A Hydrogen Ion Splitting Technique, NC 79,684, Serial # 09/022,364, Filed Dec. 20, 2001, Patent Pending.

F.J. Kub, K.D. Hobart, Method For Making Electro–Optical Devices Using Hydrogen Ion Splitting Technique, NC 79,639, Serial # 09/985,958, Filed Oct. 29, 2001, Patent Pending.

F.J. Kub, K.D. Hobart, Method For Manufacturing A Semiconductor Device Having A Thin GaN Material Directly Bonded To An Optimized Substrate, NC 79,313, Serial # 09/964,545, Filed Sep. 28, 2001, Patent Pending.

F.J. Kub, K.D. Hobart, Method Of Transfering Thin Film Functional Material To A Semiconductor Substrate Or Optimized Substrate Using A Hydrogen Ion Splitting Technique, NC 79,682, Filed Mar. 29, 2002, Patent Pending.*

F.J. Kub, K.D. Hobart, Method For Making Pyroelectric, Electro–Optical And Decoupling Capacitors Using Thin Film Transfer And Hydrogen Ion Splitting Techniques, NC 79,719, Filed Mar. 18, 2002, Patent Pending.*

* cited by examiner

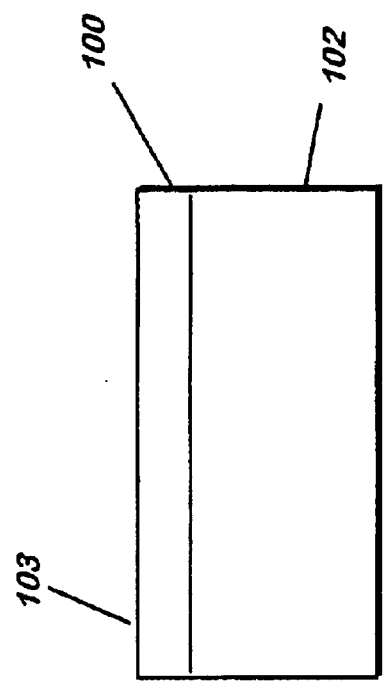
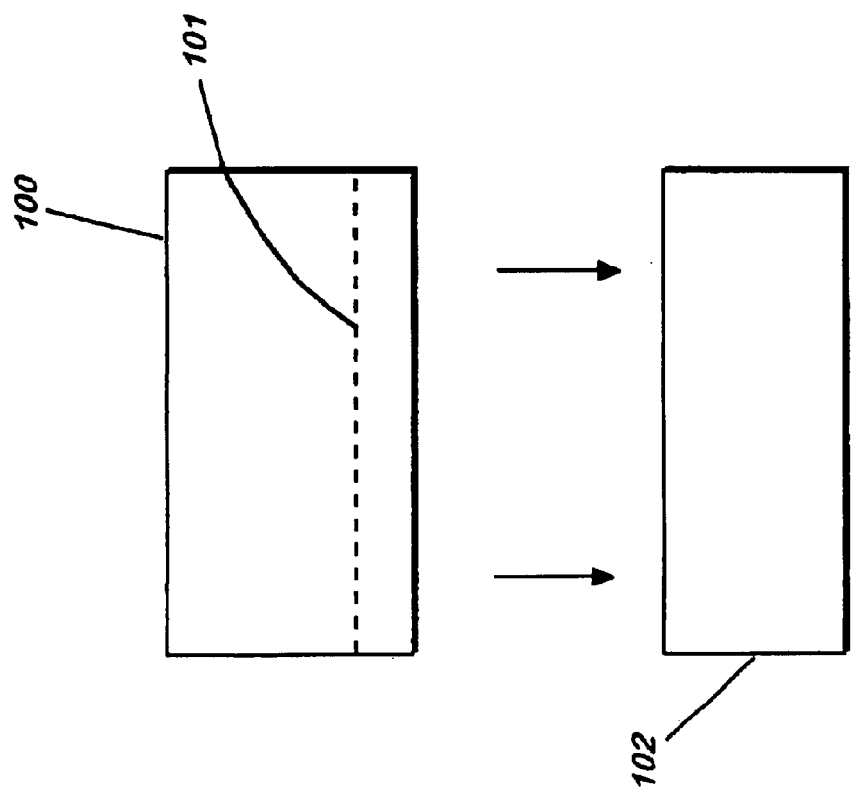
FIG. 1

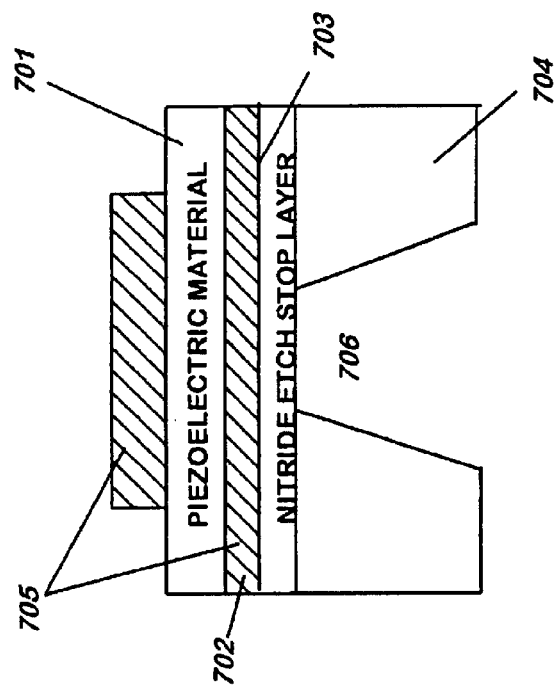
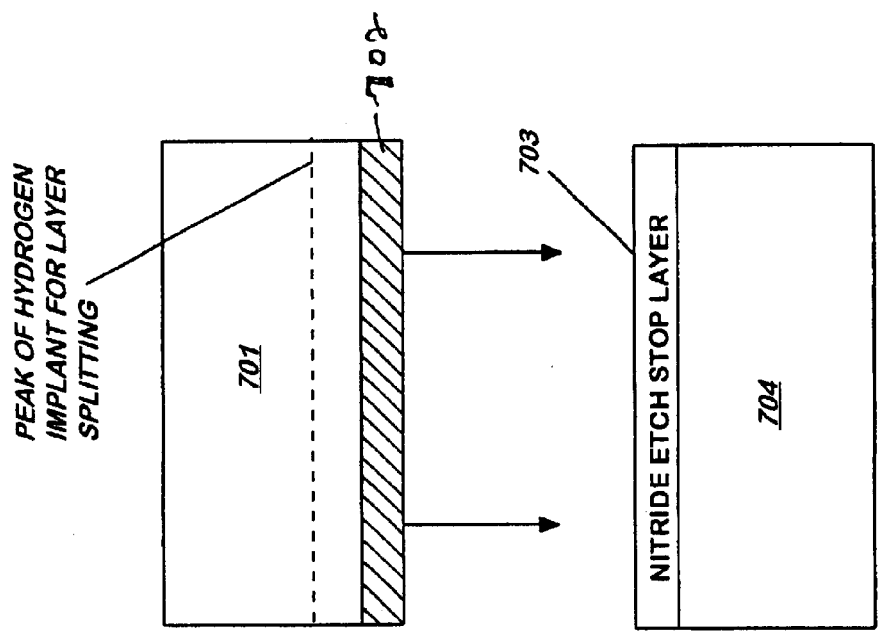
FIG. 7

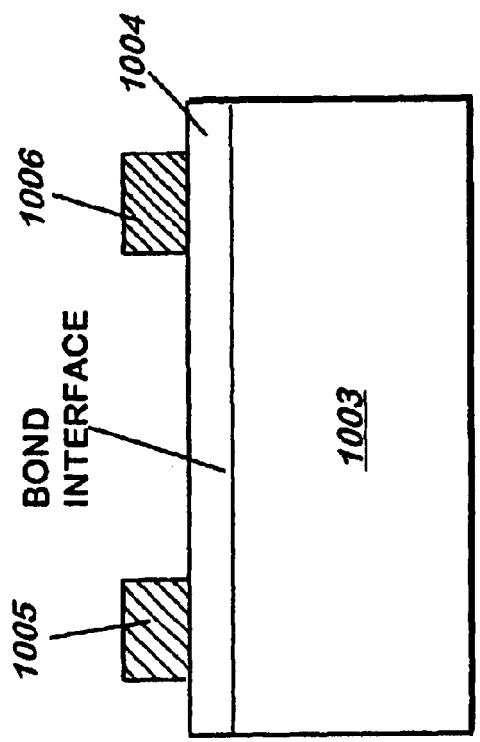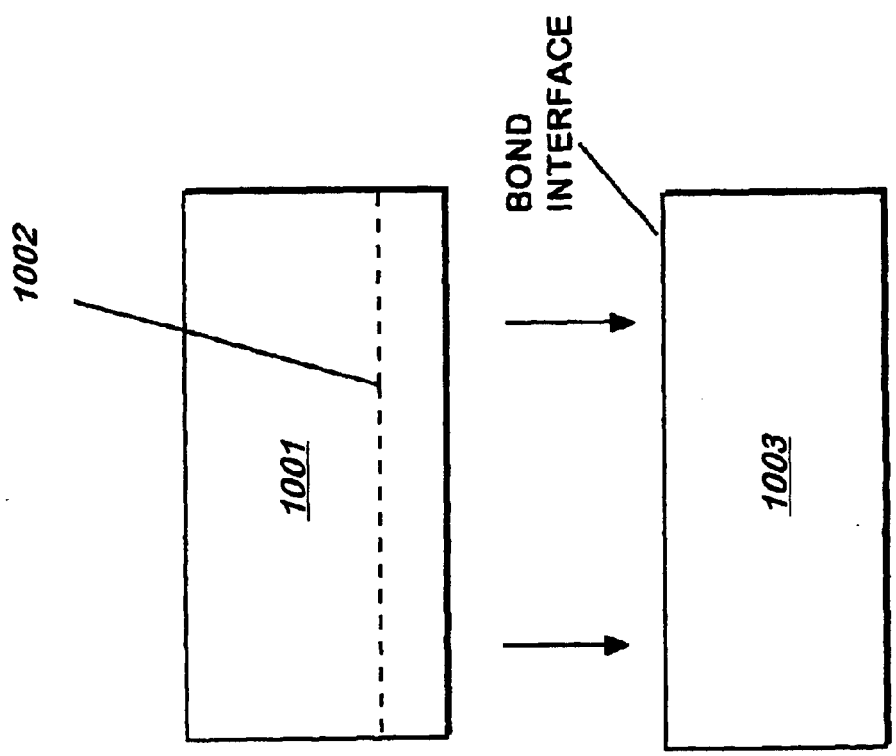
FIG. 10

METHOD FOR MAKING PIEZOELECTRIC RESONATOR AND SURFACE ACOUSTIC WAVE DEVICE USING HYDROGEN IMPLANT LAYER SPLITTING

FIELD OF THE INVENTION

The present invention relates to a method for making a piezoelectric thin film resonator using hydrogen implant layer splitting and wafer bonding to transfer thin, high quality piezoelectric material layers to an optimized substrate.

BACKGROUND OF THE INVENTION

To date, the primary approach to making thin film resonators has been to deposit thin layers of AlN or ZnO using techniques such as sputtering. The piezoelectric properties of deposited polycrystalline thin films of ZnO or AlN are generally not as good as those for single-crystal bulk substrates such as ZnO, AlN, quartz, $LiNbO_3$, or $LiTaO_3$, or for high temperature sintered ceramic materials such as lead zirconium titanate (PZT) or lead lanthanum zirconium titanate (PLZT). Typically, the Q of films made using the deposited thin film materials is smaller than one would expect for thin layers of bulk single-crystal piezoelectric material. Additionally, the thickness of the resonator material must be well controlled, since the frequency of resonance is greatly dependent upon the thickness of the piezoelectric material. A piezoelectric material develops an electric polarization when mechanically stressed by stress. In the converse effect, an applied electric field produces a mechanical distortion (strain) on a piezoelectric material.

Both single-crystal bulk substrates and high temperature sintered ceramic piezoelectric materials typically have improved piezoelectric properties, compared to thin film grown piezoelectric materials. Typical single-crystal piezoelectric substrates include lithium niobate, quartz, lithium tantalate, zinc oxide, tellurium oxide, lead zirconium titanate, lead lanthanum zirconium titanate, and relaxor ferroelectrics.

There are typically two types of thin film resonators. In one approach, a thin layer of piezoelectric material is sandwiched between two metal electrodes on a substrate in selected locations that contains an acoustic Bragg reflector mirror consisting of quarter wavelength layers of high acoustic impedance and low acoustic impedance materials. This type of thin-film resonator is solidly mounted. In another type of thin film resonator, a thin layer of piezoelectric material is sandwiched between two metal electrodes on a substrate that has an air cavity below the resonator.

Bruel, in U.S. Pat. No. 5,374,564, describes a method for making thin semiconductor material films by hydrogen implantation and heating to cause the semiconductor to split at the location of the peak of the hydrogen ion implant. It has been found experimentally that there are a number of techniques to either reduce the required hydrogen ion implantation dose or to reduce the temperature needed to cause hydrogen ion implantation substrate layer splitting process to work. One technique involves the use of a high-pressure nitrogen gas steam directed towards the side of a silicon substrate into which a high dose hydrogen ion implantation has been made. It has been experimentally found that the splitting process can occur in single-crystal semiconductor materials at room temperature for the case of a silicon substrate into which a high hydrogen ion implantation dose has been made using the high pressure nitrogen gas stream that is directed toward the edge of the wafer method. It has also been found experimentally that a helium ion implantation made in combination with a hydrogen ion implantation can be used to achieve a lower total implanted dose for the substrate layer splitting process to occur for a given anneal temperature. It has also been found experimentally that a lower substrate layer splitting temperature is achieved for the case that a hydrogen ion implantation is made into a silicon substrate having a high boron concentration. The high boron concentration can be incorporated into a silicon substrate by ion implantation. The lower temperature for hydrogen ion implantation substrate layer splitting to occur is obtained both for the case that the boron implant is annealed and for the case that the boron implant is unannealed.

Thin films of piezoelectric material are sometimes grown on single crystal substrates such as magnesium oxide or strontium titanate. The frequency of operation of the piezoelectric resonator depends strongly on the thickness of the piezoelectric material. Piezoelectric material thicknesses less than 2 microns is typically required for resonant frequency greater than 1 GHz. To date there has not been a reliable and inexpensive method for producing high frequency resonators from single-crystals of piezoelectric material.

SUMMARY OF THE INVENTION

It is an object of the present invention to produce a thin film single-crystal piezoelectric material using hydrogen implant layer splitting techniques.

It is an object of the present invention to provide a method for producing a piezoelectric resonator.

It is another object of the present invention to transfer thin layers of piezoelectric material to an appropriate substrate using hydrogen ion implant layer splitting approach and wafer bonding.

It is yet another object of the present invention to transfer thin layers of piezoelectric material to a substrate that contains CMOS or GaAs circuitry.

According to the present invention, a thin layer of single-crystal piezoelectric material can be produced by implanting hydrogen into a single-crystal piezoelectric material, wafer bonding to a substrate, and heating the material to a temperature sufficient to cause hydrogen gas in the piezoelectric material to expand and to split the crystal at the location of the peak of the hydrogen implant. Alternately, a thin layer of single-crystal piezoelectric material can be produced by implanting hydrogen into a single-crystal material, wafer bonding and directing a high pressure gas stream at the side of the wafer to cause splitting at the location of the peak of the hydrogen ion implantation.

In another embodiment of the present invention, thin layers of high quality single-crystal piezoelectric material, high temperature sintered piezoelectric material, or high quality thin film grown material are transferred to an appropriate substrate using hydrogen ion implant layer splitting and bonding. The substrate to which the thin piezoelectric material layer is transferred may contain CMOS or GaAs circuitry.

When the substrate contains CMOS or GaAs circuitry, the circuitry on the surface of the GaAs or CMOS substrate may be covered with an oxide. The oxide is then planarized using chemical mechanical polishing, and the thin film resonator material, thin film resonator having metal electrode, or thin film resonator having metal electrode and acoustic Bragg reflector materials is transferred to the GaAs or CMOS circuit using wafer bonding and hydrogen ion layer splitting.

BRIEF DESCRIPTION OF THE DRAWINGS

FIG. 1 shows the use of hydrogen ion implant layer splitting and wafer bonding to transfer piezoelectric material to an optimized substrate.

FIG. 2a shows an acoustic Bragg reflector. FIG. 2b shows an air cavity beneath the piezoelectric material/electrode.

FIG. 7 shows a thin film resonator formed by etching a depression in $SiO_2$, bonding a metal electrode to the surface, and hydrogen layer splitting.

FIG. 10 shows a method for bonding piezoelectric material on top of sapphire or other high acoustic velocity material to make a surface acoustic wave device.

DETAILED DESCRIPTION OF THE INVENTION

FIG. 1 illustrates the process of the present invention. Hydrogen is first implanted into a single-crystal or high temperature sintered piezoelectric material 100. The hydrogen ion implant both weakens the bonds between the atoms in the region of the peak of the implant and deposit a large number of hydrogen atoms into the single-crystal material in the region of the peak of the hydrogen ion implantation. The peak of hydrogen implant for layer splitting is shown at 101. In some cases, in addition to the hydrogen ion implant, helium ion can be implanted to approximately the same depth to reduce the hydrogen ion implant dose that is required for the hydrogen ion implant layer splitting process. In some cases, there can be an advantage of also performing a boron implant at the same depth as the hydrogen implant in order to reduce either the required hydrogen ion implant dose or anneal temperature to induce the hydrogen ion implant layer splitting process.

The piezoelectric material 100 is then bonded to a substrate 102 by direct or anodic bonding. The piezoelectric material is heated to cause the hydrogen gas to expand to cause splitting of the single-crystal material at the location of the peak of the hydrogen ion implantation. This process of splitting the single-crystal material near the peak of the hydrogen implant is known as hydrogen implant layer splitting. The surface of the hydrogen implant split single-crystal material typically has a surface roughness of approximately 70 nm rms. The surface can be polished to reduce the surface roughness. Metal is deposited onto the top 103 of the piezoelectric material 100 and electrodes are formed.

A. Thin Film Resonator using Acoustic Bragg Reflector

One method for producing a thin film resonant filter is to use an acoustic Bragg reflector to solidly mount the resonator rather than an air cavity beneath the thin film resonator. For this method, a thin layer of piezoelectric material is sandwiched between two metal electrodes on a substrate that contains an acoustic Bragg reflector mirror consisting of quarter wavelength layers of materials with alternating high and low acoustic impedance. In this case, the thin film resonator is solidly mounted to a substrate and is not as fragile as a thin film resonator with an air cavity.

Figure 2:
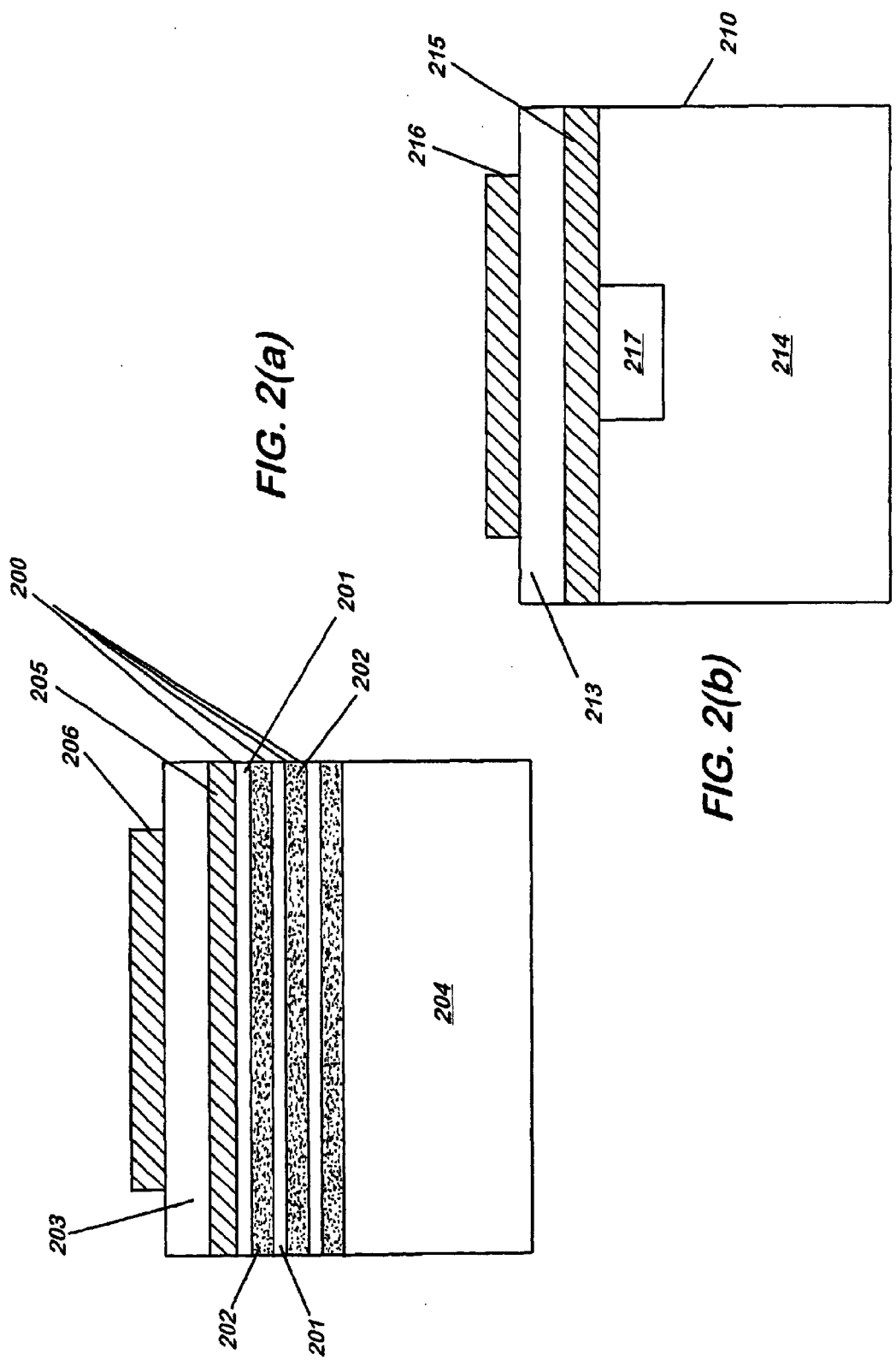
FIG. 2 shows two approaches for thin film resonators.

As shown in FIG. 2a, the acoustic Bragg reflector 200 consists of multiple alternating layers of high 201 and low 202 acoustic impedance material layers, with each layer having a quarter wavelength thickness. Typical materials that have high acoustic impedance include copper, gold, molybedenum, nickel and tungsten. Materials with low acoustic impedance include aluminum, $SiO_2$, and polymers. For example, the acoustic Bragg reflector may consist of alternating layers of tungsten and $SiO_2$, with each layer having a quarter wave thickness. The tungsten layer is typically deposited by sputtering. The $SiO_2$ layer can be deposited by any conventional method, including by sputtering or chemical vapor deposition.

The acoustic Bragg reflector material layers can be deposited onto the single-crystal piezoelectric material transducer electrode 203 using thin film growth techniques prior to wafer bonding and transferring the material. Alternatively, the acoustic Bragg reflector layers can be grown on the optimized substrate 204 and then the thin single-crystal piezoelectric material and transducer electrode 205 transferred to the surface of the Bragg reflector material layers. It can be advantageous to deposit a material such as silicon oxide or polysilicon on one or both of the surface and then chemical mechanical polish the surface to a small surface roughness value prior to the wafer bonding operation. Direct wafer bonding typically requires a surface roughness less than approximately 1 nm rms on both surfaces. Other wafer bonding techniques such as thin layer organic adhesive bonding, sodium silicate bonding, solder bonding can achieve wafer bonding with surface roughnesses that are greater than 1 nm rms.

Figure 3:
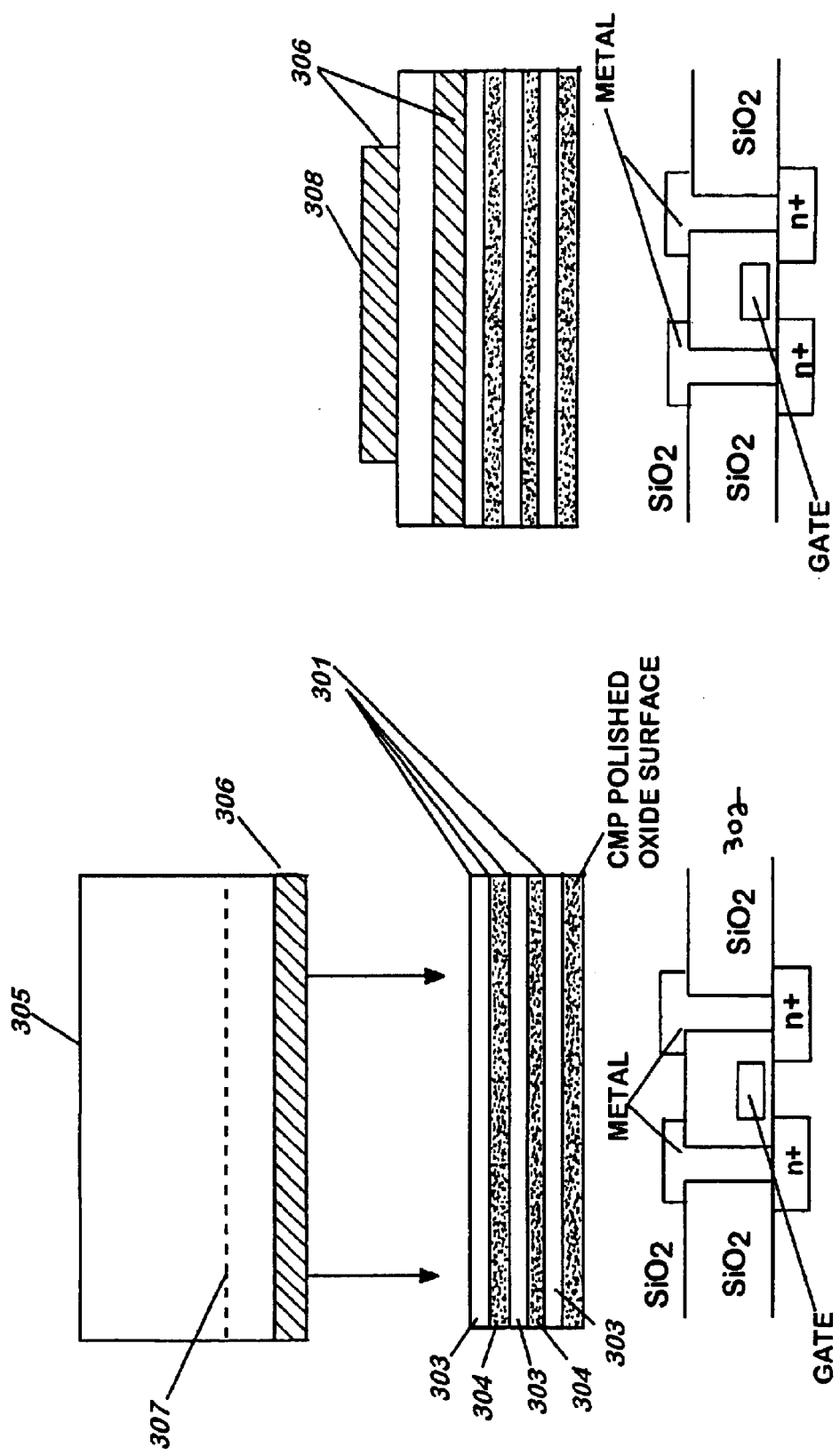
FIG. 3 shows a thin film resonator in which an acoustic Bragg reflector is deposited onto the substrate for bonding.

In an embodiment of the present invention shown in FIG. 3, an acoustic Bragg reflector 301 is grown on the substrate 302 to which the thin piezoelectric material is to be transferred. In this embodiment, multiple alternating layers of high and low acoustic impedance material layers 303,304 are grown on a substrate 302. For example, the acoustic Bragg reflector may consist of alternating layers of tungsten and $SiO_2$, with each layer having a quarter wave acoustic impedance thickness. The tungsten layer is typically deposited by sputtering. The $SiO_2$ layer can be deposited by sputtering or chemical vapor deposition at approximately 400° C. These layers can be deposited over a CMOS circuit 302.

Next, a high dose ($>1 \times 10^{16}$ $cm^{-3}$) hydrogen ion implant with an energy of approximately 65 KeV (depth of approximately 500 nm) or hydrogen ion implant in combination with either a helium or boron ion implant so that the peak of the helium or boron implant is near the peak of the hydrogen ion implant is implanted into a single-crystal piezoelectric material 305 such as $LiNbO_3$, $LiTaO_3$, ZnO, quartz, or relaxor ferroelectrics or into a high temperature sintered ceramic material such as PLZT, PZT, or the like. It may be necessary to heat the piezoelectric substrate during hydrogen implantation so that the implant damage in the crystal is partially annealed during the implant operation so that not too much implant damage is create. Too high of a level of implant damage will prevent the hydrogen ion implant layer splitting process from occurring properly.

Next, a metal electrode 306 consisting of a thin layer of chrome followed by a layer of gold is deposited onto the piezoelectric material. It can be advantageous to deposit a material such as silicon oxide or polysilicon on the surface of the gold metal and then chemical mechanical polish the surface to a small surface roughness value prior to the wafer bonding operation. Direct wafer bonding typically requires a surface roughness less than approximately 1 nm rms on both surfaces. Other wafer bonding techniques such as thin layer organic adhesive bonding, sodium silicate bonding, solder bonding can achieve wafer bonding with surface roughnesses that are greater than 1 nm rms.

The surfaces are cleaned prior to bonding to remove particulates and hydrocarbons. Cleaning may be effected by any conventional means including snow jet cleaning, RCA1, piranha, and UV-ozone to remove organics on the surface, followed by a chemical step to make the surface either hydrophilic or hydrophobic. The surface will typically be prepared to a hydrophilic surface prior to wafer bonding.

The surface of the metal electrode 306 is bonded to the surface of the substrate 302 that contains the acoustic Bragg reflector 301. This substrate may also have metal on the surface thereof so that a metal-to-metal bonding can be performed. It can be advantageous to deposit a material such as silicon oxide or polysilicon on the surface of acoustic Bragg reflector material layers and then chemical mechanical polish the surface to a small surface roughness value prior to the wafer bonding operation. Direct wafer bonding typically requires a surface roughness less than approximately 1 nm rms on both surfaces. The wafer bonding may be accomplished by any conventional method, including cold welding, anodic bonding, direct bonding, vacuum bonding, pressure bonding, microwave bonding, solder bonding, and ultrasonic bonding.

The composite is heated to cause hydrogen gas in the piezoelectric material to expand and to split the crystal at the location of the peak hydrogen implant 307. Optionally, the composite may be annealed at a low temperature, approximately 200° C., to increase the bond strength prior to hydrogen layer splitting. The splitting temperature may be on the order of about 200–800° C. An alternate material splitting approach involves directing a high pressure gas or high pressure water stream at the side of the piezoelectric material to cause the material to split at a depth into the material that is near the location of the peak of the hydrogen ion implant damage.

The proton (hydrogen) implant may create proton damage in the piezoelectric material. Therefore, an optional annealing step, such as ambient oxygen annealing, can be performed to anneal out the proton implant damage.

The hydrogen layer splitting may leave a surface roughness of approximately 8 nm. One can optionally polish the surface of the split piezoelectric material prior to depositing the metal for the top electrode 306 to obtain an improved quality factor for the resonator.

Finally, a metal is deposited onto the top surface 308, and the composite is processed in a conventional manner to make a thin film resonator with top and bottom side metal electrodes.

Figure 4:
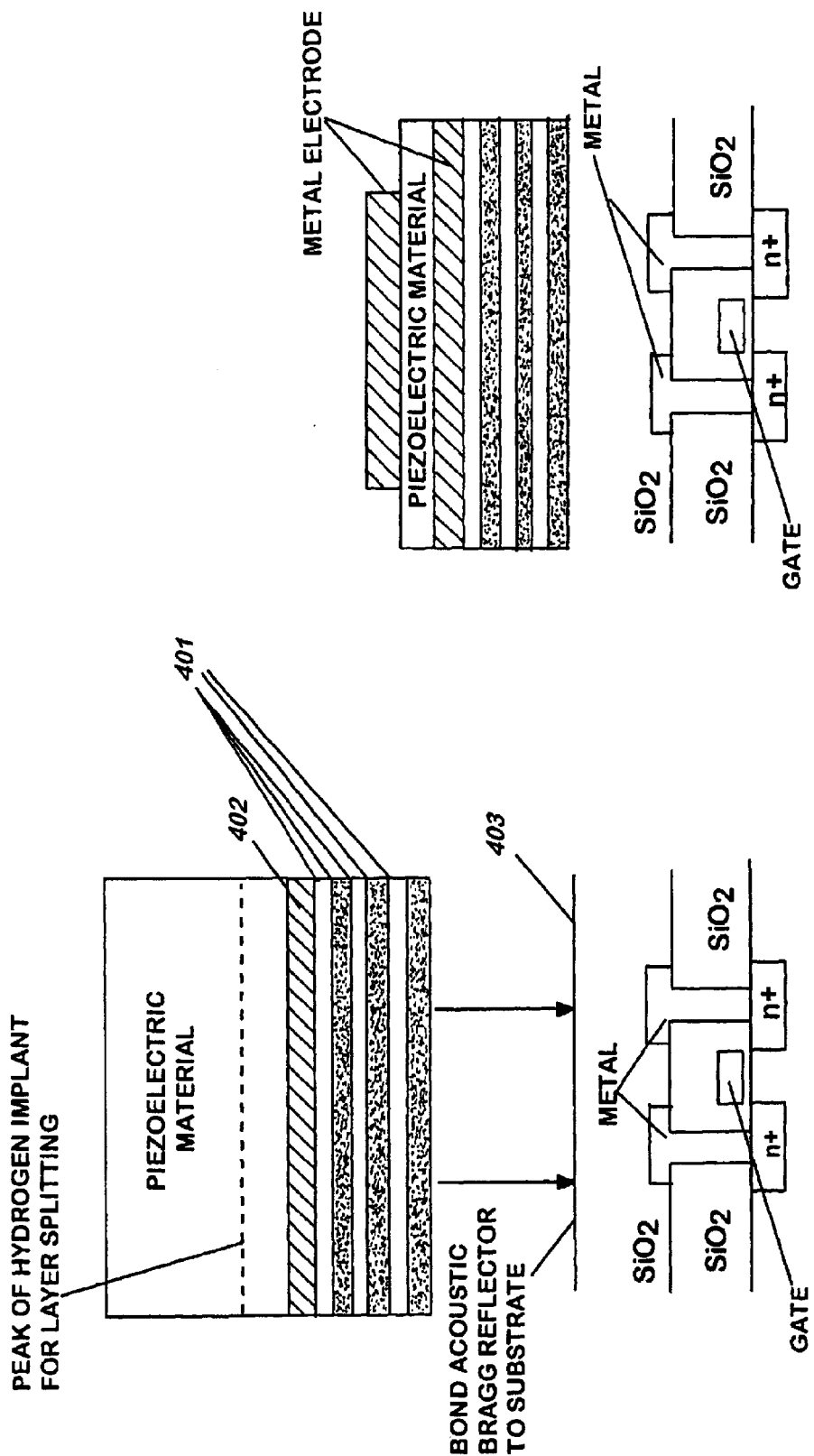
FIG. 4 shows a thin film resonator in which an acoustic Bragg reflector is deposited onto a piezoelectric material/metal electrode prior to bonding.

In another embodiment, shown in FIG. 4, the material layers for the Bragg reflector 401 can be deposited onto the single-crystal piezoelectric metal electrode surface 402, and then the surface of the Bragg reflector material bonded to the optimized substrate 403. The optimized substrate optionally contains GaAs or CMOS circuitry. In the case in which the optimized substrate contains GaAs or CMOS circuitry, it is immaterial whether the hydrogen is implanted into the piezoelectric substrate prior to depositing the Bragg reflector material layer or after depositing the Bragg reflector material layer.

If hydrogen is implanted into the piezoelectric material prior to depositing the Bragg reflector material, there is a possibility that the hydrogen will expand during deposition of the Bragg reflector material and cause premature layer splitting of the piezoelectric material. In the case in which hydrogen is implanted after the Bragg reflector deposition, the Bragg reflector thickness may be too great to allow implantation of hydrogen through the Bragg reflector material and into the piezoelectric material. The maximum implantation depth using implanters with conventional implant voltages of about 200 KeV is typically on the order of about 2000 nm.

Materials can be deposited for the Bragg reflectors include materials, which can be deposited by sputtering deposition, pulsed laser deposition, evaporation, sol-gel deposition, and nanophase piezoelectric material deposition. A lower hydrogen implant dose can be used, which will increase the splitting temperature. In the case of the lower hydrogen implant dose, hydrogen can be implanted into the piezoelectric material and then the Bragg reflector materials deposited.

Any conventional technique can be used for bonding the acoustic Bragg reflector layers to the optimized substrate. These techniques include direct wafer bonding, metal thermal compression bonding in which gold is deposited onto the Bragg reflector and a gold-gold bond formed, microwave bonding, laser bonding, solder bonding, ultrasonic bonding, adhesive bonding, and anodic bonding.

By using these techniques, the Bragg reflector is then bonded to an optimized surface. It may also be desirable to deposit a glass layer onto the Bragg reflector and then anodically bond to the optimized substrate.

B. Thin Film Resonator with Air Cavity beneath Piezoelectric Resonator

There are several approaches to making a thin film resonator 210 with an air cavity 217 beneath the piezoelectric material 215. These are:

(1) Etch a depression in a substrate 214 and wafer bond the piezoelectric/electrode material 213 over the cavity 217;

(2) form a depression in the piezoelectric/electrode material and bond to a substrate;

(3) bond the piezoelectric material/electrode to a substrate and etch the substrate from the back to make an air cavity.

All of these methods use hydrogen ion implant layer splitting and wafer bonding to obtain thin piezoelectric layers.

Figure 5:
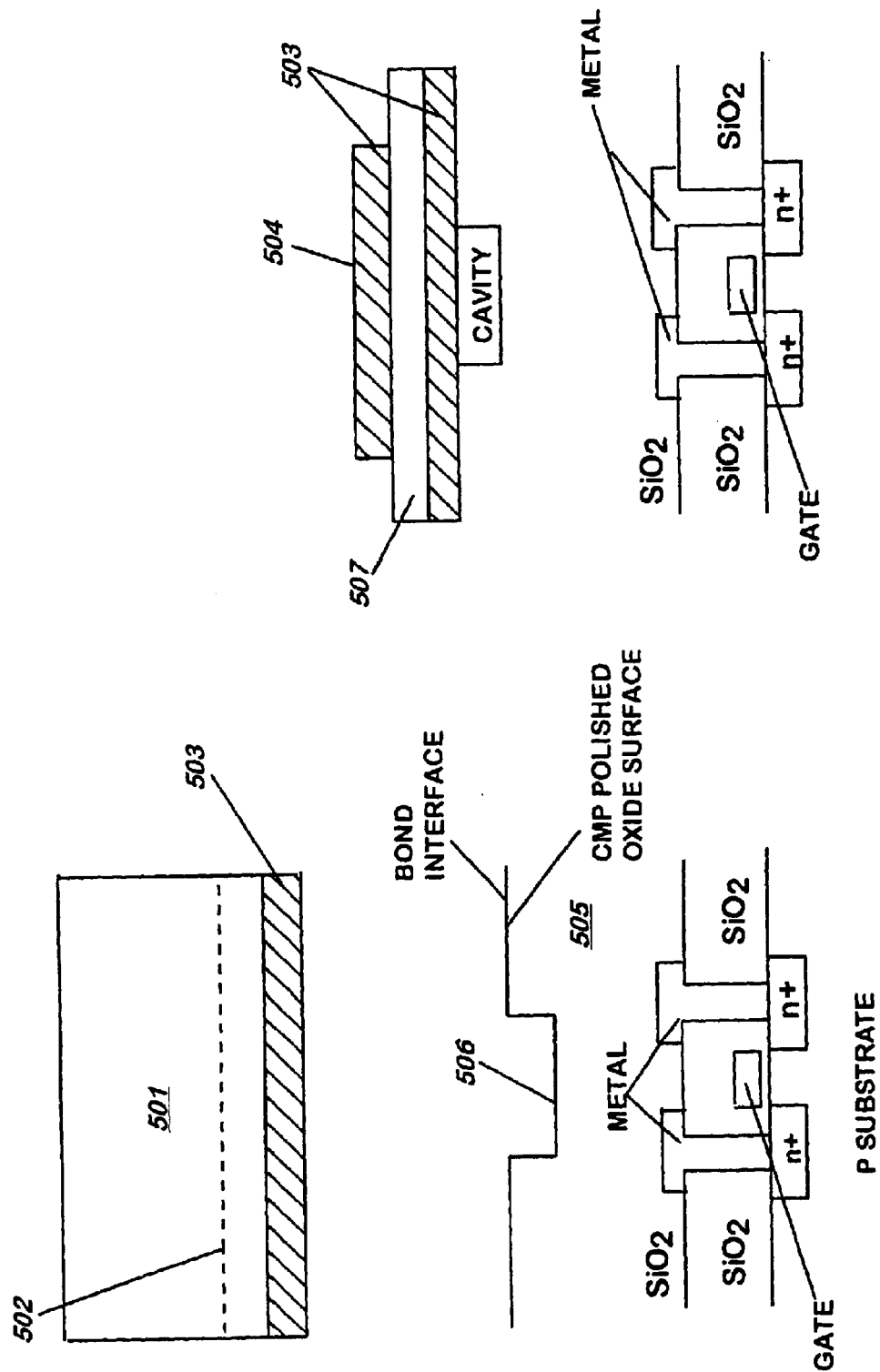
FIG. 5 shows a thin film resonator formed by etching a depression in $SiO_2$, bonding a piezoelectric material/metal electrode to the surface, and hydrogen layer splitting.

Referring to FIG. 5, the first of these methods involves first implanting hydrogen ion into the piezoelectric material 501. The path of the hydrogen implant layer for splitting is shown schematically at 502. Next, a metal electrode 504 is deposited onto the top surface of the piezoelectric material 502. An optional stiffener material such as several thousand angstroms to several microns of plated metal or deposited oxide (not shown) may be deposited on top of the metal electrode 504 to maintain the integrity of a thin piezoelectric layer during the splitting.

On a second substrate 505, a depression 506 is etched into the top surface of the material. The piezoelectric substrate metal electrode surface is bonded to the surface of the material with the cavity. The combination is then heated to cause the hydrogen gas to expand and split off the thick piezoelectric substrate from a thin piezoelectric layer 507, which is bonded to the material with the cavity 505. In this approach, there is no bonding in the area of the cavity. Thus, either the thin piezoelectric material 507 must be strong enough, or a stiffener must be added to the top surface of the piezoelectric material in order to maintain a thin freestanding layer of piezoelectric/stiffener over the cavity. A metal electrode 504 is then deposited onto the top surface of the piezoelectric material to implement the thin film resonator.

If a dielectric stiffener material has been deposited onto the metal surface as described above, the stiffener material can be etched away through defined holes in the piezoelectric/electrode material after the splitting operation, assuming that there is sufficient etch selectivity between the dielectric and metal. A CMP polish operation can also be performed on the stiffener material to achieve a surface roughness less than approximately 1 nm rms needed for direct wafer bonding. The piezoelectric material with metal electrode on the surface can also be bonded to a substrate, which contains a thin membrane over a cavity. The membrane acts as a stiffener during the hydrogen ion implant layer splitting operation.

Figure 6:
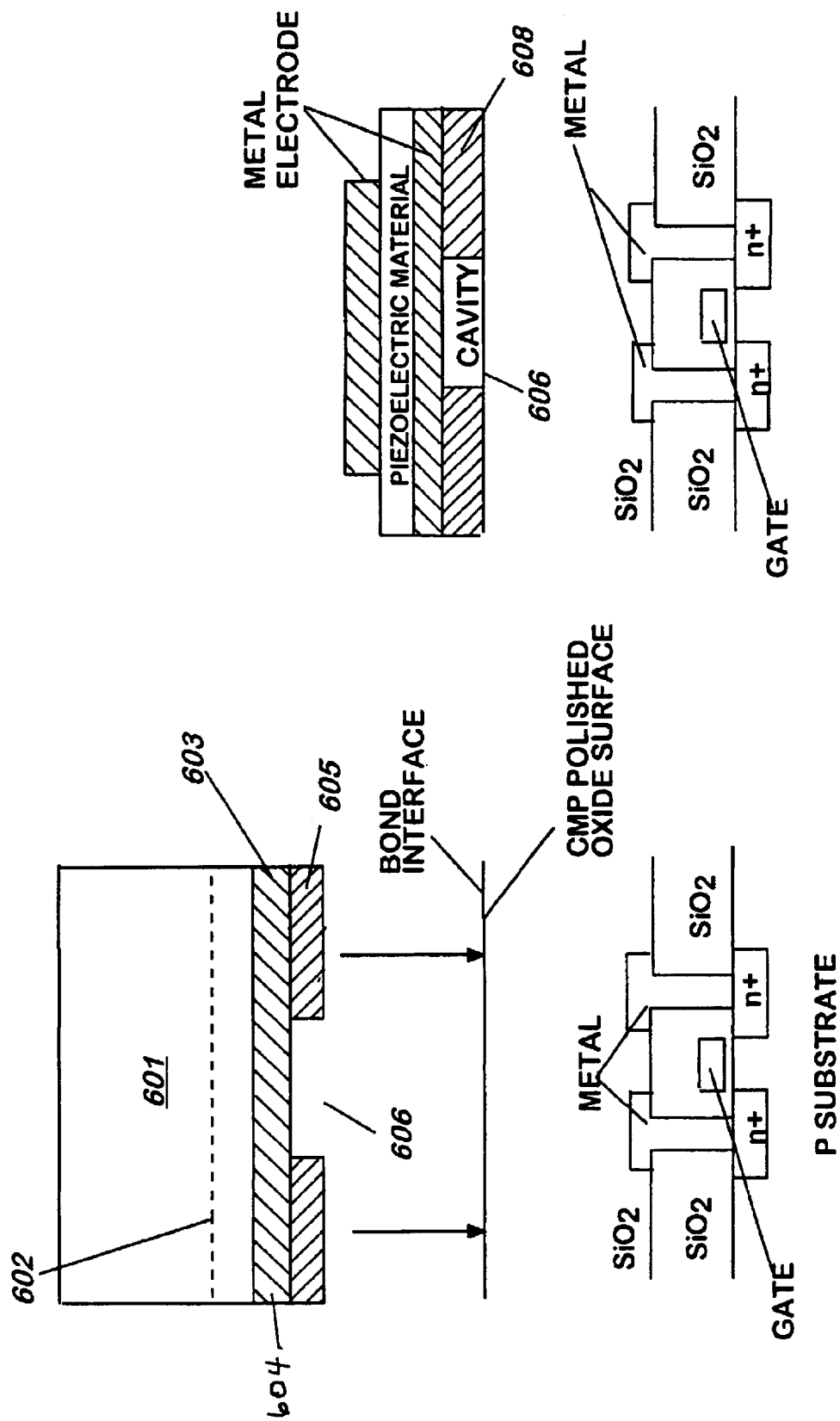
FIG. 6 shows a thin film resonator formed by etching a depression in $SiO_2$, bonding a metal electrode to the surface and hydrogen layer splitting.

In another approach, shown in FIG. 6, the depression 606 is formed in the piezoelectric/electrode material. The metal electrode 603 may be made of a multilayer system, such as a combination of chrome 604 and aluminum 605. A photostep is used to define regions where the aluminum is etched, stopping at the thin chrome electrode. When this structure is bonded to a substrate 608 a cavity 606 will be formed.

Another approach is shown in FIG. 7. In this case, the piezoelectric material 701 with metal electrode 702 on the surface is bonded to a substrate 704 which has an etch stop layer 703, such as oxide or nitride, on the surface thereof. After the hydrogen splitting, a cavity 706 is etched in the supporting substrate 704 from the backside to the etch stop 703. The etch stop material, which is preferably a nitride, can be left in place or can be removed to form the thin film dielectric resonator.

In another embodiment of this method, not shown, the thin piezoelectric material with metal electrode can be formed over a polymer or xerogel or other porous material that behaves like a cavity.

Figure 8:
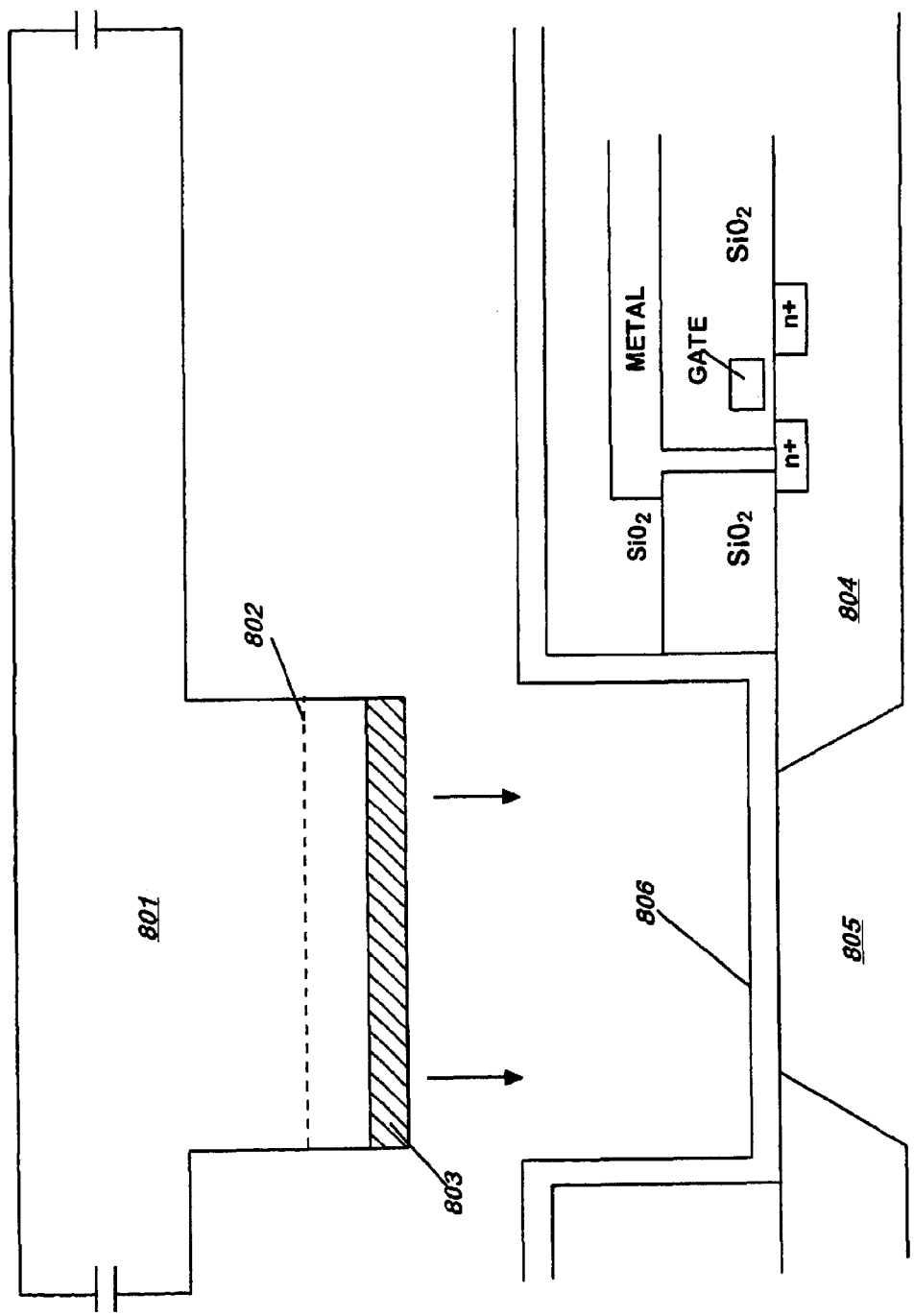
FIG. 8 shows an alterative method for making a thin film resonator with an air cavity that is compatible with CMOS circuitry.

FIG. 8 shows an alternative approach for preparing a thin film resonator with an air cavity that is compatible with CMOS circuitry. In this case, a piezoelectric substrate 801 having a hydrogen ion implant 802 for layer splitting and an electrode 803 is bonded to a P-type silicon <100> substrate 804 having an air cavity 805 and a nitride etch stop 806.

C. Integration of Thin Film Resonator with CMOS and Microwave Integrated Circuits The methods described above can be used to transfer piezoelectric/electrode material to substrates that either have been processed to contain microwave circuitry or will be processed to contain CMOS or microwave circuitry.

If the piezoelectric/electrode material is transferred to the substrate prior to microwave circuit fabrication, then the piezoelectric material must be able to withstand the processing temperatures of the microwave circuitry without degradation. Typical processing temperatures of GaAs circuitry may include an anneal temperature of about 500 EC for annealing a doping implant. For microwave circuits in which all of the doping regions are formed by epitaxy prior to transferring the piezoelectric, the processing temperatures are less than 400 EC.

If the piezoelectric material is transferred to the microwave circuitry after the microwave circuitry fabrication has been completed, it is necessary that one of the following approaches be used:

(1) There must be a planarized pedestal region higher than the top of the circuitry to which the piezoelectric material can be bonded.

(2) The dielectric over the microwave circuitry must be planarized flat potentially using chemical mechanical polishing.

(3) Plateaus (mesas) must be formed on the piezoelectric substrate, the plateaus aligned to the desired region on the microwave circuit, the piezoelectric substrate bonded to the microwave circuit, and the composite heated to cause the piezoelectric material to split.

Additional methods of integrating thin semiconductor layers with CMOS circuitry will be apparent to one skilled in this art.

Figure 9:
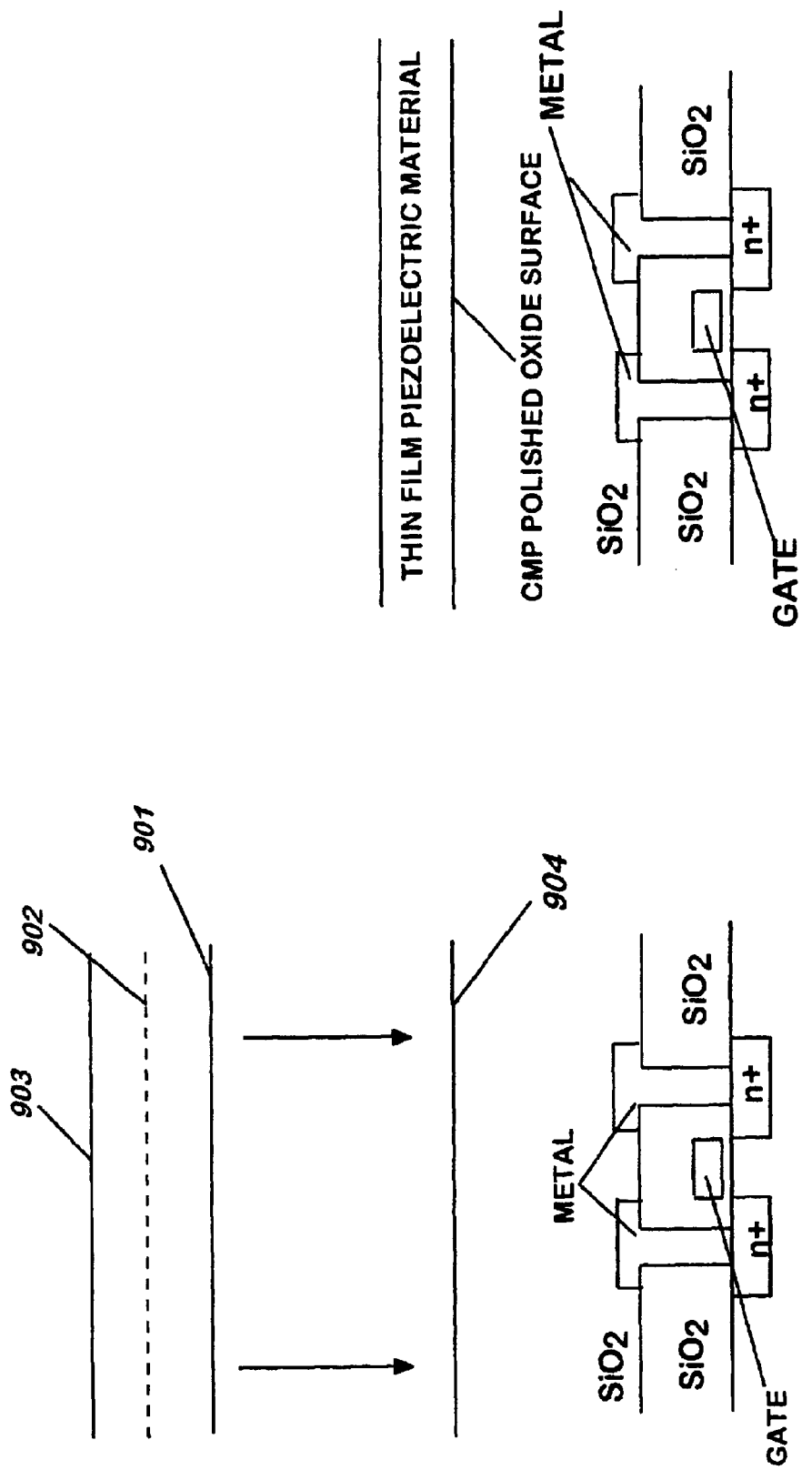
FIG. 9 shows the use of hydrogen ion implant layer splitting for transferring thin film piezoelectric material that has been grown on a MgO, $SrTiO_3$, or $LaAlO_3$ substrate to CMOS or GaAs circuitry.

FIG. 9 illustrates the hydrogen ion implant layer splitting method for transferring thin-film piezoelectric material 901 that has been grown on a substrate 902 such as MgO, $SrTiO_3$, or $LaAlO_3$. Once the hydrogen ion implant splitting layer 903 has been removed from the piezoelectric material, the thin film piezoelectric material 901 is deposited onto a CMP polished oxide surface 904.

D. Integration of Thin Film Surface Acoustic Wave Devices on High Acoustic Velocity Substrate and CMOS and Microwave Integrated Circuits Surface Acoustic Wave (SAW) devices with improved coupling efficiency and acoustic velocity can be obtained by implementing a thin piezoelectric material such as ZnO, $LiTaO$, or $LiNbO_3$ directly onto a high acoustic velocity substrate material such as sapphire, diamond, or diamond grown on silicon substrate. A thin piezoelectric layer is formed on a sapphire substrate by using hydrogen implant layer splitting and wafer bonding approach to split off a thin layer of ZnO from a ZnO single crystal substrate.

FIG. 10 illustrates this process, in which a single-crystal ZnO piezoelectric material 1001 is hydrogen implanted using a dose greater than approximately $5 \times 10^{16}$ and an energy of approximately 100 KeV. The surfaces are cleaned, and the ZnO single crystal 1001 is bonded to the sapphire substrate 1003. Bonding can be effected by any suitable means, such as by anodic bonding or direct wafer bonding. The composite is then heated to split a thin layer of ZnO 1004 from the ZnO single crystal. The ZnO layer 1004, which remains, has a thickness in the range of approximately 100 nm to about 2000 nm, depending upon the hydrogen ion implant energy that was used. This layer is bonded to the sapphire substrate 1003. The surface of the ZnO layer 1004 can optionally be polished to reduce surface roughness. Next, input 1005 and output 1006 metal transducer electrodes are formed on the top of the ZnO surface to produce the SAW device. A similar process as described above can be used to implement a thin LiNbO3 or LiTaO single-crystal layer on a sapphire or diamond substrate or diamond grown on silicon substrate.

Figure 11:
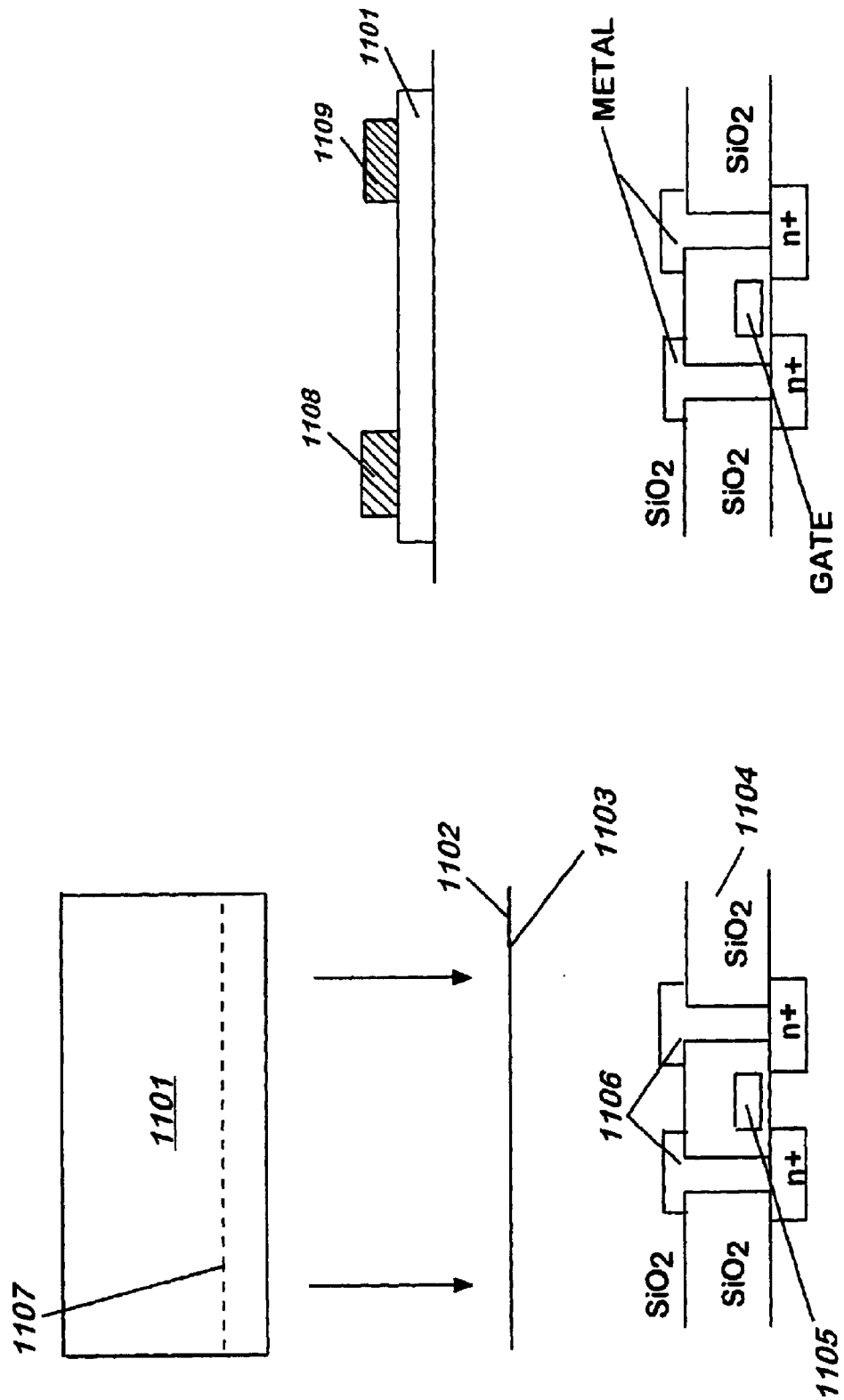
FIG. 11 shows a method for bonding piezoelectric material on top of CMOS or GaAs circuitry to produce a surface acoustic wave device.

FIG. 11 shows another embodiment of the present invention. A single crystal piezoelectric material 1101 is bonded at a bond interface 1102 to a CMP polished oxide surface, and then to a P substrate 1104 having a gate 1105 and metal terminals 1106. After the piezoelectric material is split by hydrogen implant splitting at the peak of hydrogen implant 1107, input and output metal transducer electrodes 1108 and 1109, are used to form a composite.

Another embodiment includes providing a metal layer between the thin ZnO material and a substrate to confine the surface acoustic wave in the thin ZnO material to obtain better coupling efficiency. In yet another embodiment, Bragg acoustic reflectors consisting of quarter wavelength acoustic reflectors can be located beneath the ZnO material. The acoustic Bragg reflectors are located between the thin ZnO layer and a supporting substrate.

E. Formation of Thin $LiNbO_3$ Piezoelectric Transducer for Accousto-Optic Bragg Cell High frequency (about 3–4 Ghz) Bragg cells requires a thin (about 250–500 nm) $LiNbO_3$ piezoelectric transducer. Currently, polishing and ion milling is used to obtain thin $LiNbO_3$ transducers. Bragg cells made this way currently cost in excess of $75,000.00 because of the complex thinning process. Therefore, the hydrogen implant layer splitting process is an attractive method to form thin $LiNbO_3$ layers inexpensively.

Figure 12:
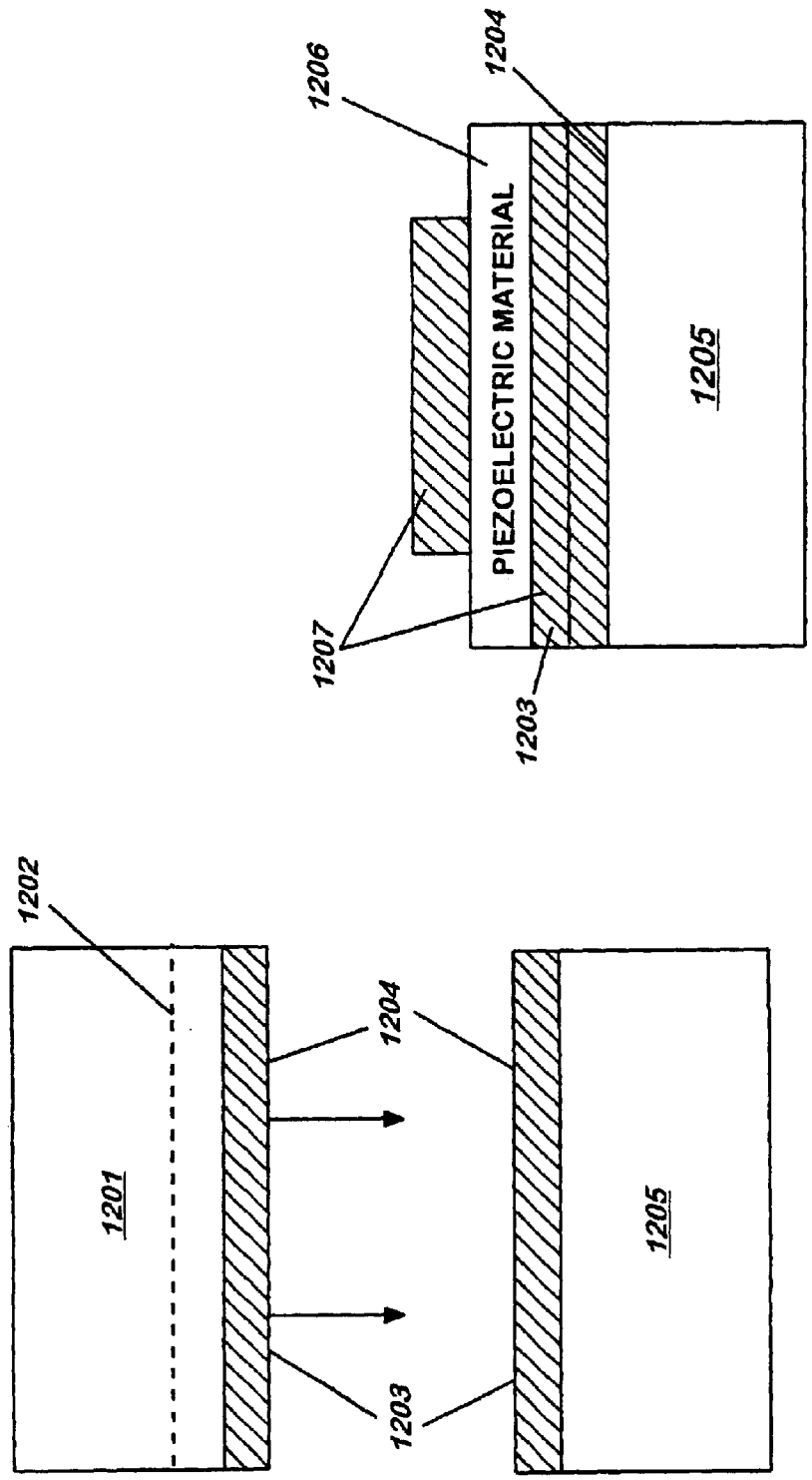
FIG. 12 shows a piezoelectric transducer for an acoustic Bragg cell formed by hydrogen implant layer splitting technique.

The process for forming thin $LiNbO_3$ layers is illustrated in FIG. 12. Hydrogen and/or helium ions are implanted into $LiNbO_3$ piezoelectric material 1201. A thin metal layer 1203 is then deposited onto the $LiNbO_3$ surface. The thin metal layer 1203 is then bonded to the surface of a Bragg cell crystal 1205. The Bragg cell crystal may also have a metal layer 1204 on the surface thereof. Any conventional bonding techniques known to those skilled in the art may be used, including pressure, cold welding, microwave bonding, thermocompression bonding, and ultrasonic bonding. The composite is heated to cause the hydrogen gas to expand (peak of hydrogen implant for layer splitting is shown at 1202) and split off the thick piezoelectric substrate from a thin piezoelectric layer 1206 having a metallic electrode 1203, which is bonded to the optimized substrate 1205. Optionally, a high-pressure gas or water stream can be directed toward the side of the hydrogen ion implanted material to cause the piezoelectric material to split near the location of the peak of the hydrogen ion implantation. After splitting, the surface of the thin piezoelectric material can be optionally chemical mechanical polished to reduce the surface roughness. A metal electrode 1207 is then deposited onto the top surface of the $LiNbO_3$ material 1206 to implement a piezoelectric transducer for the Bragg cell.

The present method for producing thin film resonators has many advantages over the conventional methods for making thin film resonators, including:

(1) the ability to make high frequency thin film transducer resonators with a well controlled piezoelectric material thickness inexpensively rather than using an expensive grinding and polishing approach;

(2) the ability to make high frequency thin film transducer resonators using single-crystal piezoelectric material.

It is extremely important in making thin film resonators that the thickness of the resonator material be well controlled, since the frequency of resonance greatly depends on the thickness of the piezoelectric material. In the present invention, the implant energy of hydrogen ion is used to determine the thickness of the piezoelectric material. The thickness of the piezoelectric material using the hydrogen ion implant method can be controlled to better than one percent.

Major applications for thin film resonators include bandpass filters for cellular telephones and wireless communication, as all superheterodyne receivers for wireless communication include bandpass filters. It would be advantageous to integrate these bandpass filters directly onto CMOS or GaAs integrated circuits. Other applications include microbalances for gas sensors and biological sensors.

The foregoing description of the specific embodiments will so fully reveal the general nature of the invention that others can, by applying current knowledge, readily modify and/or adapt for various applications such specific embodiments without undue experimentation and without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. The means, materials, and steps for carrying out various disclosed functions may take a variety of alternative forms without departing from the invention.

Thus, the expressions "means to . . . " and "means for . . . ", or any method step language, as may be found in the specification above and/or in the claims below, followed by a functional statement, are intended to define and cover whatever structural, physical, chemical, or electrical element or structure, or whatever method step, which may now or in the future exist which carries out the recited functions, whether or not precisely equivalent to the embodiment or to embodiments disclosed in the specification above, i.e., other means or steps for carrying out the same function can be used; and it is intended that such expressions be given their broadest interpretation.

What is claimed is:

1. A method for making a thin film piezoelectric material bonded to a substrate, the method comprising the steps of:

implanting a single-crystal piezoelectric material with hydrogen;

bonding the single-crystal piezoelectric material to the surface of a substrate; and causing the piezoelectric material to split at the location of the peak of the hydrogen implant.

2. A method for making a thin film resonator, the method comprising the steps of:

implanting a single-crystal piezoelectric material with hydrogen ions;

depositing a first metal electrode onto the single-crystal piezoelectric material;

bonding the surface of the first metal electrode to the surface of a substrate that contains an acoustic Bragg reflector to form a composite;

causing the single-crystal piezoelectric material to split at the peak of the hydrogen implant; and depositing a second metal electrode on the top surface of the composite in selected locations to produce a thin film resonator with top and bottom side first and second metal electrodes.

3. A method for making a thin film resonator, the method comprising the steps of:

implanting a single-crystal piezoelectric material with hydrogen ions;

forming a first metal electrode on single-crystal piezoelectric material;

depositing material layers for a Bragg reflector onto the surface of the first metal electrode;

bonding the surface to the Bragg reflector material to a substrate to form a composite; causing the single-crystal piezoelectric material to split at the peak of the hydrogen implant; and depositing a second metal electrode on the top surface of the composite in selected locations to produce a thin film resonator with top and bottom side first and second metal electrodes.

4. The method according to claim 3, wherein the piezoelectric metal electrode is heated prior to bonding the surface to the Bragg reflector.

5. The method according to claim 3, wherein the piezoelectric metal electrode is heated after to bonding the surface to the Bragg reflector.

6. The method according to claim 3, further comprising the step of performing an annealing step.

7. The method according to claim 3, wherein the substrate contains a porous material that behaves like a cavity.

8. The method according to claim 3, wherein the substrate has been processed to contain microwave circuitry or CMOS.

9. A method for making a thin film resonator with an air cavity beneath a piezoelectric resonator, the method comprising the steps of:
   implanting hydrogen ions into piezoelectric material;
   depositing a first metal electrode onto the surface of the piezoelectric material;
   optionally depositing a stiffener material on top of the first metal electrode;
   etching a depression on the top surface of a substrate;
   bonding the piezoelectric/first metal electrode to the substrate to form a composite;
   causing the piezoelectric material to split at the location of the peak of the hydrogen implant; and
   depositing a second metal electrode onto the top surface of the piezoelectric material.

10. The method according to claim 9, wherein a stiffener material has been deposited on top of the first metal electrode and the stiffener material is etched away after the splitting.

11. The method according to claim 9, further including positioning a thin membrane is located over the depression on the top surface of the substrate.

12. The method according to claim 9, wherein the substrate has been processed to contain microwave circuitry or CMOS.

13. A method for making a thin film resonator with an air cavity beneath a piezoelectric resonator, the method comprising the steps of:
   implanting hydrogen ions into single-crystal piezoelectric material;
   depositing a first metal electrode onto the surface of the single-crystal piezoelectric material;
   optionally depositing a stiffener material on top of the first metal electrode;
   etching a depression into the surface of the piezoelectric material;
   bonding the piezoelectric/first metal electrode to a substrate;
   causing the single-crystal piezoelectric material to split at the location of the peak of the hydrogen ion implantation; and
   depositing a second metal electrode onto the top surface of the piezoelectric material; and
   wherein the depression in the surface of the piezoelectric material forms a cavity in the composite.

14. A method for making a thin film resonator with an air cavity beneath a piezoelectric resonator comparing:
   implanting hydrogen ions into single-crystal piezoelectric material;
   depositing a first metal electrode onto the surface of the single-crystal piezoelectric material;
   optionally depositing a stiffener material on top of the first metal electrode;
   bonding the single-crystal piezoelectric material/first metal electrode to a substrate which has an etch stop layer on the surface thereof to form a composite;
   causing the single-crystal piezoelectric material to split at the location of the peak of the hydrogen ion implantation and form a thin piezoelectric layer, which is bonded to the substrate;
   etching a cavity in the substrate; and
   depositing a second metal electrode onto the top surface of the piezoelectric material.

15. A method for making a surface acoustic wave device, the method comprising the steps of:
   hydrogen ion implanting into a single crystal piezoelectric material;
   bonding said single crystal piezoelectric material to a high acoustic velocity substrate material to form a composite;
   causing the single-crystal piezoelectric material to split at the location of the peak of the hydrogen ion implantation to form a thin layer single crystal piezoelectric material bonded to said high acoustic velocity substrate; and
   forming input and output metal transducer electrodes on top of the single crystal piezoelectric material.

16. The method according to claim 15, further including the step of:
   placing an acoustic Bragg reflector is located between the single-crystal piezoelectric material and the high acoustic velocity substrate.

17. The method according to claim 15, further including the step of:
   placing a metal layer is located between the thin single-crystal piezoelectric material and the high acoustic velocity substrate.

18. The method according to claim 15, wherein the thin layer single-crystal piezoelectric material has a thickness in the range of about 100 nm to about 2000 nm.

19. The method according to claim 15, wherein the Bragg acoustic reflector consists of quarter wavelength acoustic reflectors.

20. A method for making a thin film resonator, the method comprising the steps of:
   implanting a single-crystal piezoelectric material with hydrogen ions;
   depositing a first metal electrode onto the single-crystal piezoelectric material;
   forming an acoustic Bragg reflector on metal electrode;
   bonding the surface of the metal electrode to the surface of a substrate that contains an acoustic Bragg reflector to form a composite;
   causing the hydrogen gas in the piezoelectric material to expand and to split the piezoelectric single-crystal at the peak of the hydrogen implant; and
   depositing a metal on the top surface of the composite to produce a thin film resonator with top and bottom side metal electrodes.

* * * * *